US009476616B2

(12) United States Patent
Muller et al.

(10) Patent No.: US 9,476,616 B2
(45) Date of Patent: Oct. 25, 2016

(54) MAGNETOCALORIC THERMAL GENERATOR

(75) Inventors: Christian Muller, Strasbourg (FR); Jean-Claude Heitzler, Horbourg-Wihr (FR)

(73) Assignee: Cooltech Applications Societe Par Actions Simplifiee, Holtzheim (FR)

( * ) Notice: Subject to any disclaimer, the term of this patent is extended or adjusted under 35 U.S.C. 154(b) by 952 days.

(21) Appl. No.: 13/123,590

(22) PCT Filed: Oct. 13, 2009

(86) PCT No.: PCT/FR2009/001200
§ 371 (c)(1),
(2), (4) Date: Apr. 11, 2011

(87) PCT Pub. No.: WO2010/043782
PCT Pub. Date: Apr. 22, 2010

(65) Prior Publication Data
US 2011/0192833 A1    Aug. 11, 2011

(30) Foreign Application Priority Data

Oct. 16, 2008   (FR) ..................................... 08 05725

(51) Int. Cl.
| | |
|---|---|
| H05B 6/00 | (2006.01) |
| F25B 21/00 | (2006.01) |
| H01L 37/04 | (2006.01) |

(52) U.S. Cl.
CPC ............. *F25B 21/00* (2013.01); *H01L 37/04* (2013.01); *F25B 2321/0022* (2013.01); *Y02B 30/66* (2013.01)

(58) Field of Classification Search
CPC ................................ F25B 21/00; H01L 37/04
USPC ................ 219/618, 672, 628, 443.1, 121.36, 219/137 R, 75; 62/3, 3.1, 6, 467, 476; 165/166, 104.26, 167, 81
See application file for complete search history.

(56) References Cited

U.S. PATENT DOCUMENTS

| | | | |
|---|---|---|---|
| 7,481,064 B2 | 1/2009 | Kitanovski et al. | |
| 2003/0218391 A1* | 11/2003 | Hirata | H04R 9/063 310/12.16 |
| 2005/0110366 A1* | 5/2005 | Chang et al. | 310/268 |

(Continued)

FOREIGN PATENT DOCUMENTS

| | | |
|---|---|---|
| FR | 07/07612 | 10/2007 |
| FR | 07/07612 A1 | 10/2007 |

(Continued)

*Primary Examiner* — Phuong Nguyen
(74) *Attorney, Agent, or Firm* — Davis & Bujold, PLLC; Michael J. Bujold

(57) ABSTRACT

A heat generator (10) which comprises magnetocaloric elements (2) that are arranged in a circle about a central axis. A magnetic arrangement (3) of alternating magnetized and non-magnetized zones (4, 5), that is located within the circle formed by the magnetocaloric elements (2), is rotatable around the central axis and co-operates with a field closing device (6) to loop magnetic flux generated by the magnetic arrangement (3) and alternately subject the magnetocaloric elements (2) to a magnetic field variation and create, alternately in each magnetocaloric element (2), heating and cooling cycles, in synchronization with the circulation of heat transfer fluid which flows through the magnetocaloric elements (2) during the heating and cooling cycles. The field closing device (6) comprises a heat insulation (9).

17 Claims, 6 Drawing Sheets

(56) References Cited

U.S. PATENT DOCUMENTS

| | | | |
|---|---|---|---|
| 2005/0120720 A1* | 6/2005 | Fang | F25B 21/00 62/3.1 |
| 2007/0125095 A1 | 6/2007 | Iwasaki et al. | |
| 2007/0130960 A1* | 6/2007 | Muller et al. | 62/3.1 |
| 2008/0236172 A1 | 10/2008 | Muller et al. | |
| 2008/0272664 A1* | 11/2008 | Flynn | 310/154.01 |
| 2009/0320499 A1 | 12/2009 | Muller et al. | |
| 2010/0095686 A1 | 4/2010 | Cramet et al. | |
| 2010/0236258 A1 | 9/2010 | Heitzler et al. | |

FOREIGN PATENT DOCUMENTS

| | | | |
|---|---|---|---|
| FR | 2 904 098 A1 | 1/2008 | |
| FR | 2 914 051 A1 | 9/2008 | |
| WO | WO 03016794 A1 * | 2/2003 | F25B 21/00 |
| WO | 2004/059221 A1 | 7/2004 | |
| WO | 2005/093343 A1 | 10/2005 | |
| WO | 2007/026062 A1 | 3/2007 | |

* cited by examiner

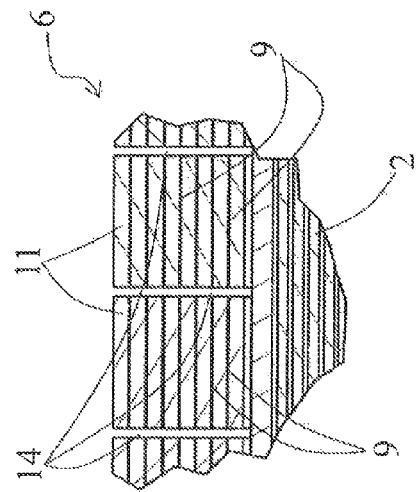
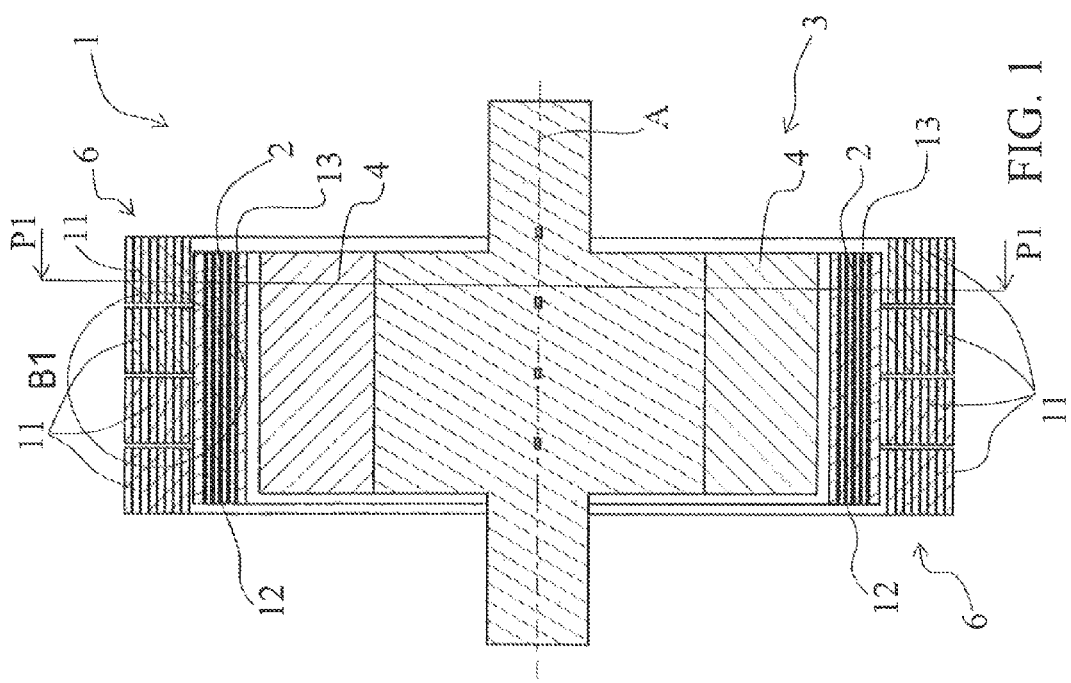

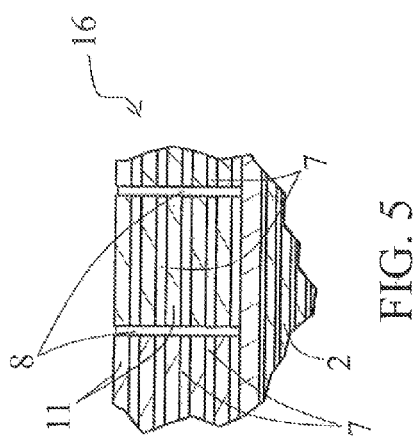
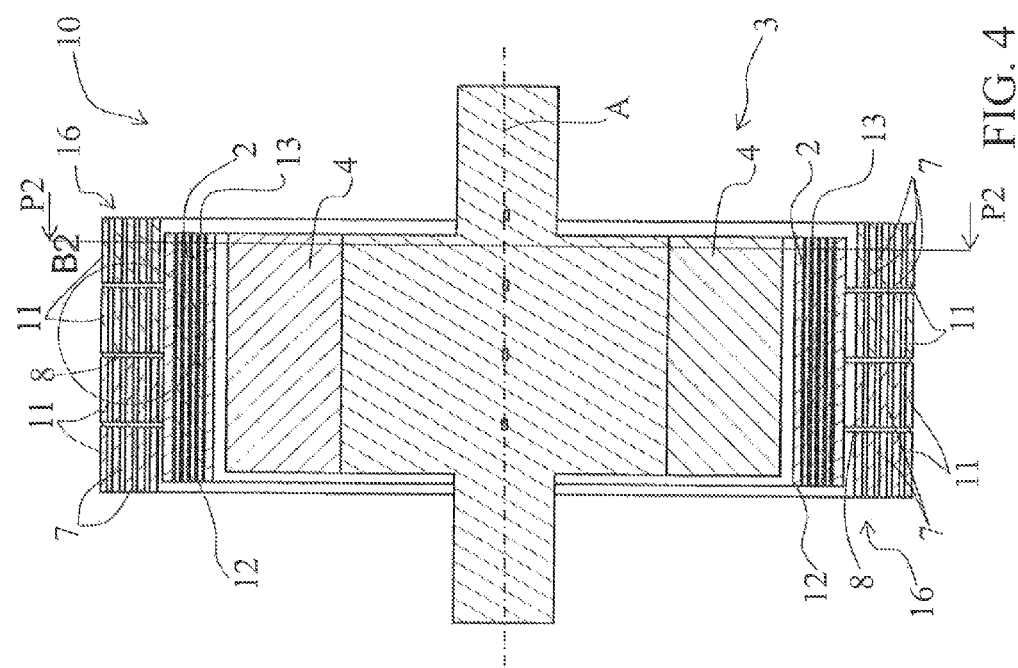

MAGNETOCALORIC THERMAL GENERATOR

This application is a National Stage completion of PCT/FR2009/001200 filed Oct. 13, 2009, which claims priority from French patent application serial no. 08/05725 filed Oct. 16, 2008.

FIELD OF THE INVENTION

The present invention relates to a heat generator comprising magnetocaloric elements arranged in a circle around a central axis, a magnetic arrangement made of alternating magnetized zones and non magnetized zones, located inside of the circle formed by the magnetocaloric elements, the magnetic arrangement being rotated around the central axis and co-operating with a field closing device arranged to loop the magnetic flux generated by the magnetized zones so as to subject alternately the magnetocaloric elements to a magnetic field variation and create alternately in each magnetocaloric element a heating cycle and a cooling cycle, in synchronization with the circulation of at least one heat transfer fluid arranged to pass through the magnetocaloric elements during the heating and cooling cycles.

BACKGROUND OF THE INVENTION

Magnetic refrigeration technology has been known for more than twenty years and the advantages it provides with regard to ecology and sustainable development are widely acknowledged. Its limits in terms of its useful calorific output and efficiency are also well known. Consequently, all the research undertaken in this field is focused on improving the performance of such a generator, by adjusting the various parameters, such as the magnetization power, the performance of the magnetocaloric element, the heat exchange surface between the heat transfer fluid and the magnetocaloric elements, and the performance of the heat exchangers, etc.

To that purpose, several types of heat generators with magnetocaloric elements are known, and in particular the magnetocaloric generators comprising a circular structure in which the magnetocaloric elements are arranged in a circle around a central axis and are subjected to a variable magnetic field allowing to create alternately in each of the magnetocaloric elements a heating cycle and a cooling cycle. Such a generator is described in the French patent application no. 07/07612 by the applicant. In this generator, the thermal energy generated by magnetocaloric elements is exchanged with a heat transfer fluid that is forced through the magnetocaloric elements by circulation means. The variation of the magnetic field is obtained by alternating magnetized zones and non magnetized zones, which rotate around the central axis, and are located inside the ring formed by the magnetocaloric elements. They are associated with a field closing device realized in the form of a ring and arranged around the magnetocaloric elements to close or loop the magnetic flux generated by the magnetized zones through the magnetocaloric elements.

The use of such an approximately circular ring is common in the known magnetocaloric generators. It is generally made out of a ferromagnetic material arranged around and in contact or close to the magnetocaloric elements. The ring is made all in one piece. Nonetheless, such a ring shows a certain number of disadvantages.

A first disadvantage relates to the limited ability of this ring to ensure the return of the magnetic field between two magnetized zones. In fact, it consists of a large machined, little structured metallic mass in which the crystalline or metallurgic fibres do not exist or are oriented randomly and do not assist in the achievement of a strong induction in the ring. Furthermore, manufacturing this ring is expensive in terms of material loss.

The second disadvantage inherent to the use of such a ring stems form the fact that it is made of a heat conductive material, which leads to a thermal energy transfer between the ring and the magnetocaloric elements (heat losses) and thus reduces the heat capacity of the heat generator in which it is mounted. The thermal energy produced by the magnetocaloric elements is intended to be exchanged with a heat transfer fluid passing through the latter, and not with the ring achieving the magnetic field return.

SUMMARY OF THE INVENTION

The present invention aims to overcome these disadvantages by offering a heat generator comprising magnetocaloric elements and a field closing device that is simple to manufacture, cost-effective and has an improved efficiency.

For this purpose, the invention concerns a heat generator having a field closing device that comprises a heat insulation means.

Preferably, and according to a first embodiment variant of the invention, the field closing device can be made of at least one magnetically conductive sheet metal strip that is coiled on itself, arranged around the magnetocaloric elements and covered, at least partly, with a layer of heat insulating material that forms the heat insulation means.

The sheet metal strip must be understood as a strip of material produced by hot or cold rolling. This process enables creating magnetic flux lines oriented in the direction of rolling and thus allows obtaining, in the field closing device, a desired magnetic field orientation, and therefore easily and effectively increases the efficiency of the heat generator.

According to a second variant, the field closing device can be made of at least one magnetically conductive sheet metal strip, that is coiled on itself, arranged around the magnetocaloric elements and comprises, between its successive turns, at least partly, a layer of heat insulating material that forms the heat insulation means.

According to a third variant, the field closing device can be made of at least one magnetically conductive sheet metal strip, that is coiled on itself, arranged around the magnetocaloric elements, whose successive turns are spaced out from each other and in which the heat insulation means is made of the air volume located between the successive turns.

In each of the above-mentioned variants, the field closing device can be made of an assembly of at least two sheet metal strips arranged side by side and spaced out from each other.

To increase the heat insulation, the field closing device can also comprise a heat insulation means formed by a ring made of a heat insulating material and integrated into the space located between two adjacent sheet metal strips.

According to the invention, the heat insulation means can be a varnish made out of a heat insulating material that covers at least one side of the sheet metal strip.

Furthermore, the field closing device can be made, at least partly, of iron or of an iron alloy with one of the materials chosen from a list including cobalt and silicon.

To increase the efficiency of the field closing device, the coiled sheet metal strip can comprise at least one cut-out, in which a canalizing device for the magnetic field lines can be integrated, which extends longitudinally in the field closing device and is arranged opposite to a magnetocaloric element.

The canalizing device for the magnetic field lines can be made of an assembly of parts made out of a magnetically conductive material, each arranged in a radial plane of the field closing device, side by side and spaced out from each other.

Furthermore, the parts can be separated from each other by a heat insulating material.

Preferably, the canalizing device for the magnetic field lines can have a trapezoidal shape, whose base is located opposite to a magnetocaloric element, has approximately the same width as the latter and whose opposite base has a smaller width.

Furthermore, permanent magnets can form the magnetized zones of the magnetic arrangement.

BRIEF DESCRIPTION OF THE DRAWINGS

The present invention and its advantages will be better revealed in the following description of an embodiment given as a non limiting example, in reference to the drawings in appendix, in which:

FIG. 1 is a simplified sectional view of a heat generator according to the invention, along its central axis, FIG. 2 is a view of detail B1 of FIG. 1, FIG. 4 is a view similar to that of FIG. 1 of an embodiment variant of the generator according to the invention, FIG. 5 is a view of detail B2 of FIG. 4.

DETAILED DESCRIPTION OF THE PREFERRED EMBODIMENTS

In the implementation examples shown, identical parts or sections have the same numerical references.

Figure 3:
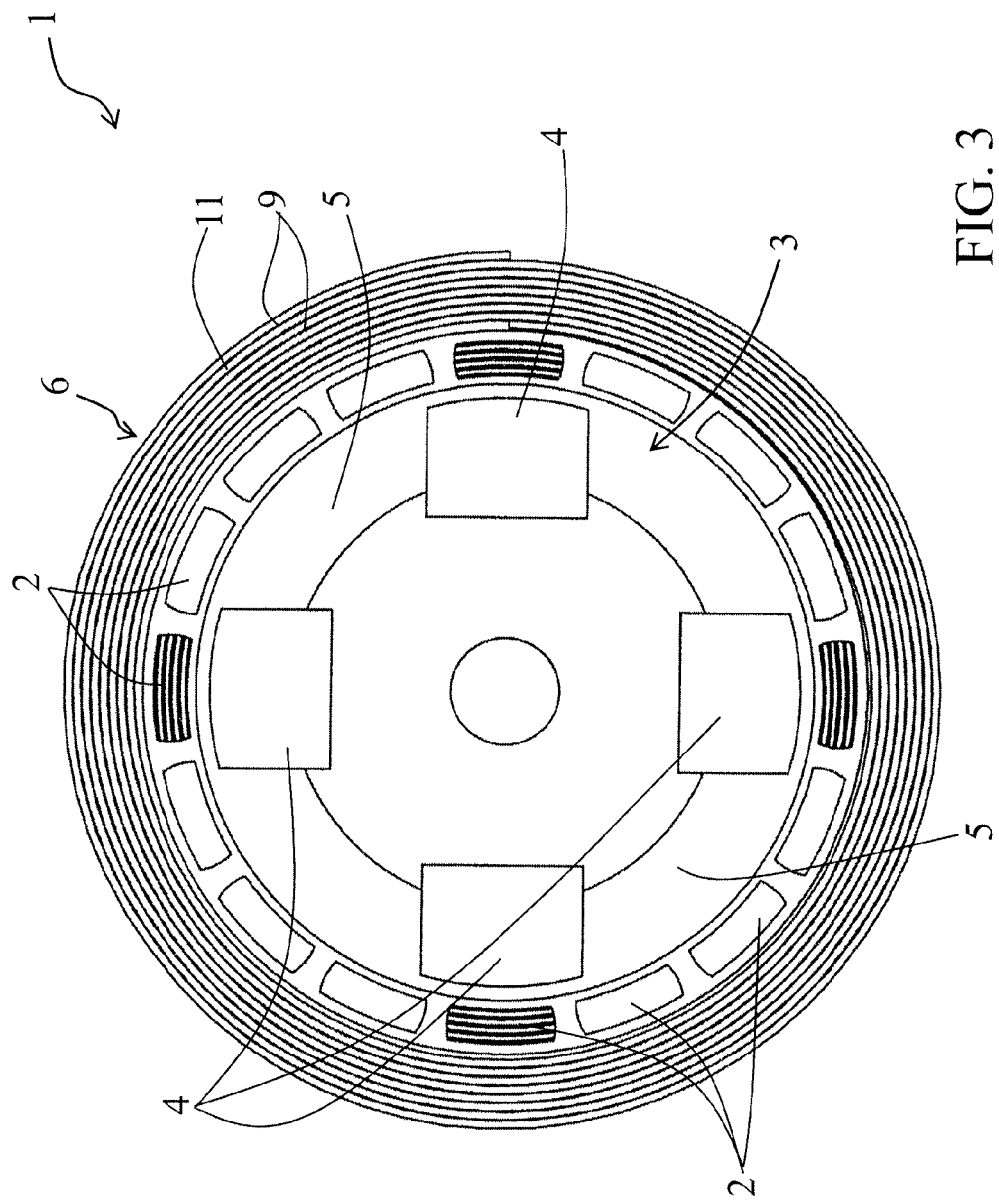
FIG. 3 is a sectional view along plane P1 of FIG. 1.

In reference to FIGS. 1, 2 and 3, the generator 1 according to the invention is made of an assembly of magnetocaloric elements 2 arranged in a circle around a central axis A.

The magnetocaloric elements 2 are subject to a magnetic field variation obtained thanks to the rotation of a magnetic arrangement 3 around the central axis A, the magnetic arrangement 3 co-operates with a field closing device 6 that is arranged to loop the magnetic flux generated by the magnetic arrangement 3. This magnetic field variation leads to the alternation of heating and cooling cycles in each magnetocaloric element 2.

The magnetic arrangement 3 comprises permanent magnets 4 that are separated from each other by an angle of 90° and have opposite polarities, which create magnetized zones 4 alternating with non magnetized zones 5. It is of course possible to choose another suitable configuration.

A heat transfer fluid is circulated through the magnetocaloric elements 2 in synchronization with the variation of the magnetic field. The displacement of this heat transfer fluid, in relation with the variation of the magnetic field, facilitates creating and maintaining, a temperature gradient between the two opposite ends 12 and 13 of each magnetocaloric element 2.

These magnetocaloric elements 2 are thus permeable to the heat transfer fluid and can be made out of one or several magnetocaloric materials. They comprise open fluid passages that can be made of the pores of a porous material, mini or micro-channels machined in a full block or obtained by assembling, for example, superposed grooved plates.

The means for circulating the heat transfer fluid through each magnetocaloric element 2 are not represented. They can be pistons positioned on one or on both ends of each magnetocaloric element, for example, or any other means which provides the heat transfer fluid with a reciprocating flow.

Likewise, the heat generator according to the invention is intended to exchange thermal energy with one or several external user circuits (heating, air-conditioning, tempering, etc.), and is connected with them by the intermediary of a heat exchanger, for example, or by any other suitable and not represented means.

Advantageously, the magnetic field closing device 6 is made of four sheet metal strips 11, each of which is coiled on itself and comprises a varnish layer 9 made out of a heat insulating material which forms a heat insulating means. These four sheet metal strips 11 are made out of an iron-cobalt alloy and are adjacent to each other with a free space between them. They are arranged around the magnetocaloric elements 2 and achieve the closing of the magnetic field generated by the magnets 4 of the magnetic arrangement 3.

The use of sheet metal strips 11 to make the field closing device 6 reduces the cost of the latter. The sheet metal machining process is widely used and leads to less material losses than the cutting process. Furthermore, the coiling of the sheet metal strips 11 is also easy to implement and allows for easy adaptation to any heat generator diameter.

The rolling and coiling of the sheet metal coils 11 on themselves further allow a maximum induction in the field closing device 6, and thus to an increase in the intensity of the magnetic flux passing through each magnetocaloric element 2 and, therefore, to an increase in the effectiveness and thermal efficiency of the heat generator 1 according to the invention.

The use of the sheet metal strips 11 also allows them to be integrated into a heat insulating means that prevents heat exchange between the field closing device 6 and the magnetocaloric elements 2 which is adjacent to the latter, and this on the length of the magnetocaloric elements and at their ends 12 and 13, where the temperature difference is at a maximum.

So, thanks to this varnish 9, the field closing device 6 ensures its function of closing the magnetic flux (closing the magnetic field lines) between two rotating permanent magnets 4, without dissipating the thermal energy produced by the magnetocaloric elements 2.

Furthermore, the free spaces 14 between the adjacent sheet metal strips 11 even improve the heat insulation between the field closing device 6 and the magnetocaloric elements 2, which increases the thermal efficiency of the heat generator 1 according to the invention.

For simplification purposes, only the magnetocaloric elements 2 opposite the permanent magnets 4 have been represented in FIG. 3.

Figure 6:
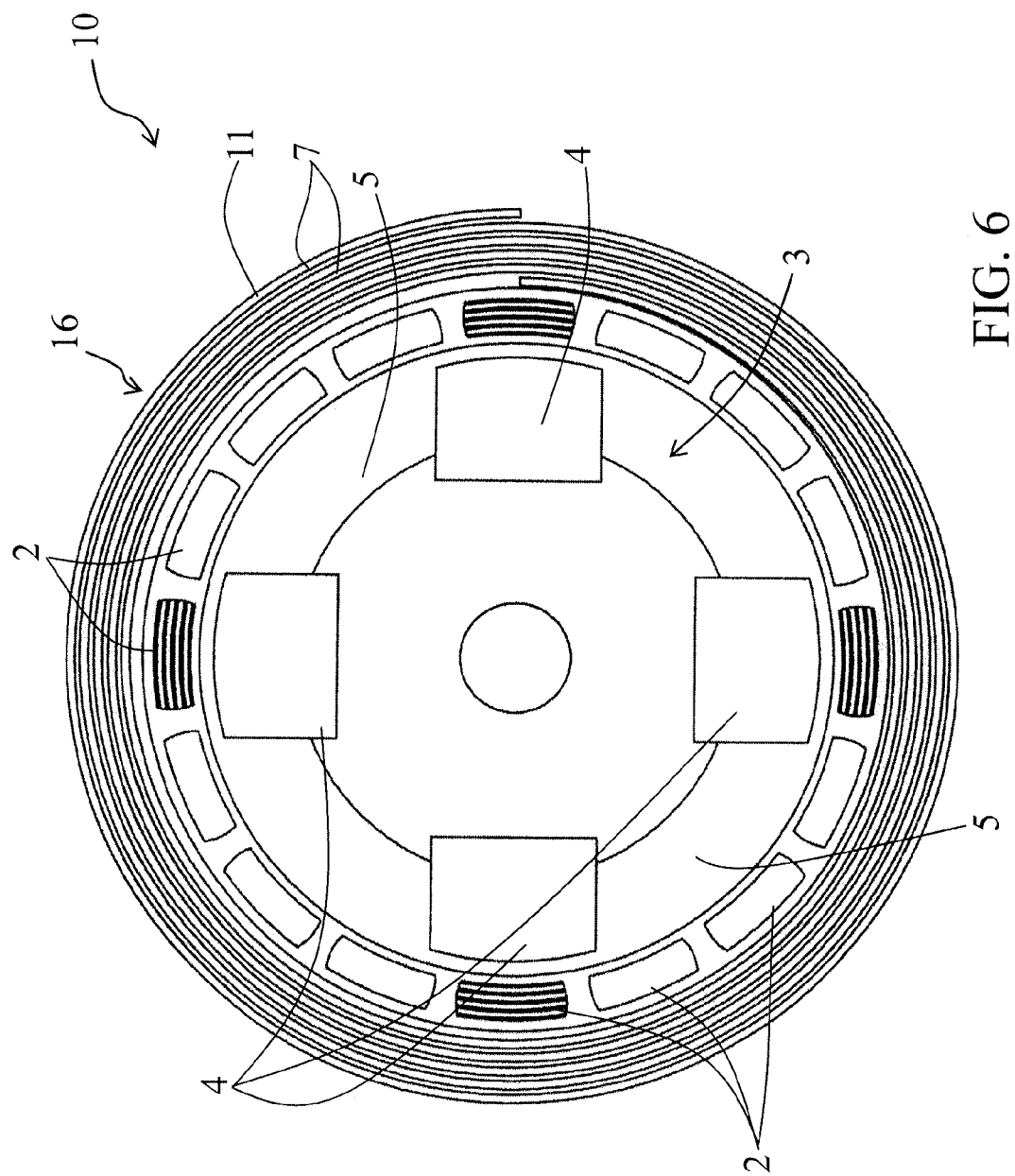
FIG. 6 is a sectional view along plane P2 of FIG. 4.

The heat generator 10 represented in FIGS. 4 to 6 distinguishes itself from the heat generator 1 of the previous figures by the fact that the field closing device 16 is made of sheet metal strips 11, between which a thicker layer 7 made of a heat insulating material is inserted, and that the space located between two adjacent sheet metal strips 11 is filled by a ring 8, also made out of a heat insulating material.

This heat insulating material layer 7 forms the heat insulation means and is arranged between the various turns of the sheet metal strips 11, and is therefore not applied on a side of the latter, as it is in the heat generator 1 described previously.

It is furthermore possible not to integrate any layer of material between the turns, the volume of air located between the successive turns forming the heat insulation means. To that purpose, spacing means such as spacers for example, preferably made out of a heat insulating material, can be arranged between the successive turns.

This heat generator 10 presents the same advantages as that described above in relation with FIGS. 1 to 3.

Also in this example of implementation, for the purpose of simplification of FIG. 6, only the magnetocaloric elements 2 opposite the permanent magnets 4 have been represented.

The heat generator 20 represented in FIGS. 7 to 10 distinguishes itself from the heat generator 1 of FIGS. 1 to 3 by the fact that the field closing device 26 is made of sheet metal strips 11 which are cut and which integrate a canalizing device 15 for the magnetic field lines at the level of the magnetocaloric materials 2. Such a device 15 is preferably, as it appears on FIG. 7, arranged at the level of each magnetocaloric element 2 and consists of a device conducting the magnetic lines.

This canalizing device 15 can be made of parts 17, such as for example cut-out sheet metal plates assembled next to each other according to a longitudinal line of the heat generator 20, while being spaced. They can be made out of the same sheet metal strips 11 as used to make the field closing device 26. The position of these parts 17 above the magnetocaloric elements 2 allows canalizing the magnetic flux in them, the latter being guided or looped between two successive canalizing devices 15 through the intermediary of the arcs of a circle formed by the coiled sheet metal strips 11. The efficiency of the heat generator 20 is therefore increased.

Figure 9:
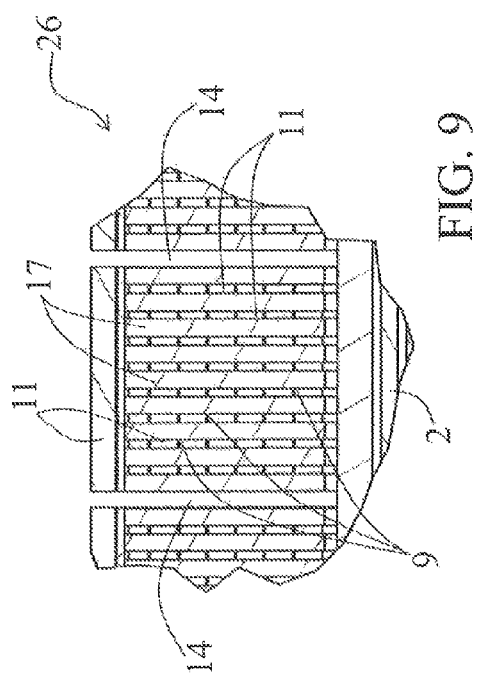
Figure 10:
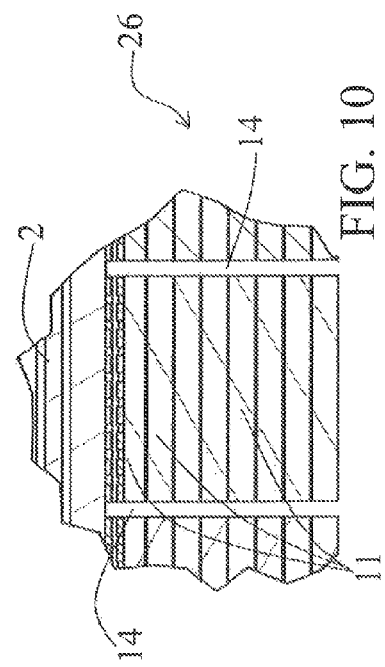
Figure 8:
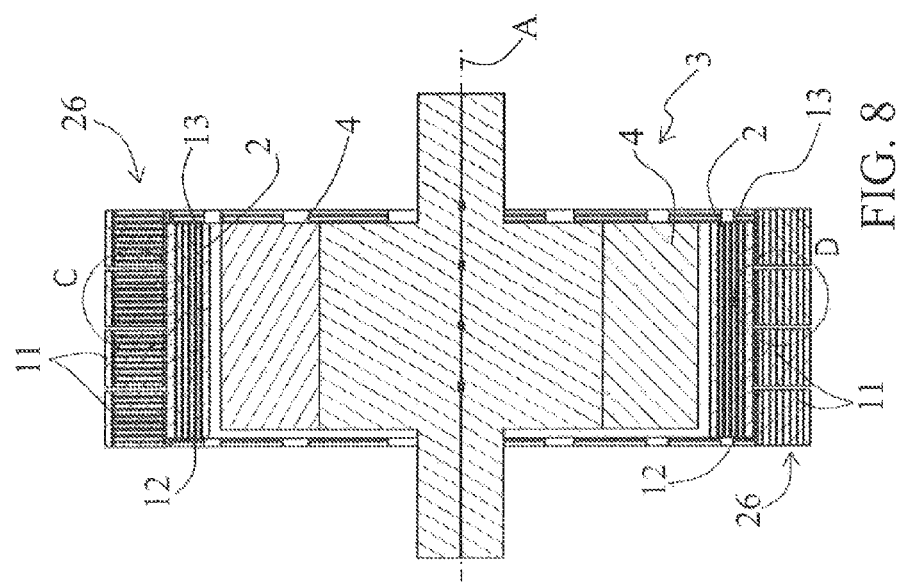
FIG. 8 is a sectional view along plane B of FIG. 7, and FIGS. 9 and 10 are views of details C and D of FIG. 8.

As shown more particularly in FIG. 9, the parts 17 which make up the canalization device 15 are arranged parallel to each other, each of them being located in a radial plan around the central axis A. They have the shape of trapezoids whose base located opposite to a magnetocaloric element 2, has approximately the same width as the latter and whose opposite base is shorter. Such a configuration allows for optimization of the efficiency of the canalizing device 15.

Furthermore, the space between two consecutive parts 17 is air, which acts as heat insulation and thus furthers the reduction of heat losses in the generator.

Figure 7:
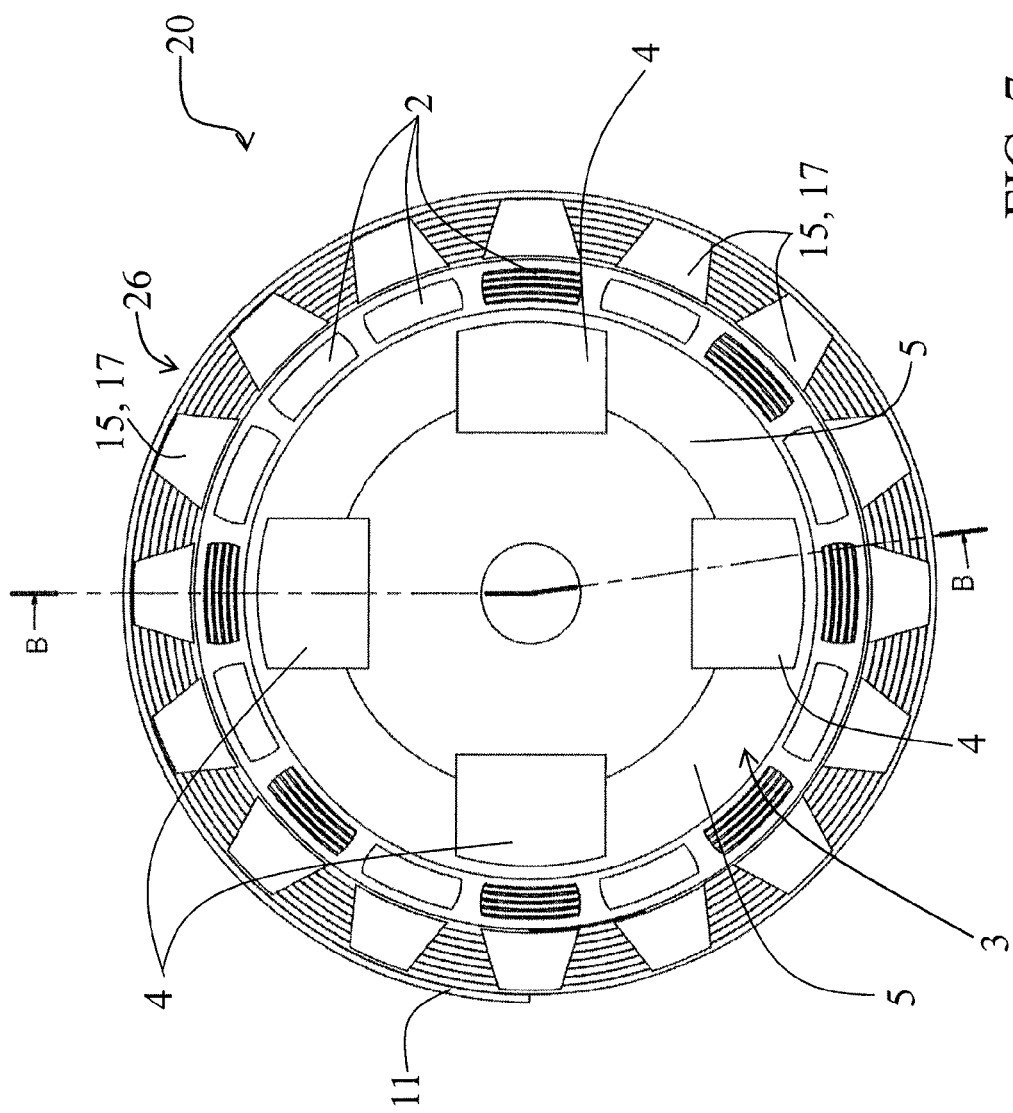
FIG. 7 is a view similar to that of FIG. 3 of another embodiment variant of the generator according to the invention.

Also in this example of implementation, for the purpose of simplifying FIG. 7, not all magnetocaloric elements 2 have been represented.

In an unrepresented variant, a heat insulating material can be arranged between the parts 17 or applied, partly or not, on at least one side of the parts 17. In this last case, the insulating material can be a varnish, a coating or a specific treatment, for example, or any other suitable form.

In another unrepresented variant, the canalizing device 15 can have the form of a solid or massive element made out of a magnetically conductive material.

Preferably, and as appears in the attached drawings, the magnetic arrangement 3 and the field closing device 6 have the same length, which also corresponds to that of the magnetocaloric elements 2. A different configuration can however be contemplated, without departing from the scope of protection of the present invention. The same applies to the number of strips 11 used.

In addition, even though all of the attached drawings illustrate a heat generator 1, 10, 20 comprising only one circular set made up of magnetocaloric elements 2, the invention also provides for the manufacture of a heat generator having a stepped structure with several sets. Such a configuration allows for an even increased efficiency of the heat generator according to the invention.

POSSIBILITIES FOR INDUSTRIAL APPLICATION

This description clearly shows that the invention achieves the goals defined, that is to say it offers a heat generator 1, 10, 20 with a simple design and limited production costs, in which the field closing device 6 ensures its function of closing the magnetic field without interfering with the operation of the heat generator 1, 10, 20, nor affecting its thermal efficiency.

Such a heat generator 1, 10, 20 can find industrial and domestic application in the area of heating, air conditioning, tempering, cooling or others, at competitive costs and with reduced space requirements.

Furthermore, all parts making up the heat generator 1, 10, 20 can be manufactured according to reproducible industrial processes.

The present invention is not restricted to the examples of embodiment described, but extends to any modification or variant which is obvious to a person skilled in the art while remaining within the scope of the protection defined in the attached claims.

The invention claimed is:
1. A heat generator (1, 10, 20) comprising:
a plurality of magnetocaloric elements (2) being arranged in a circumferential arrangement around a central axis (A) and being subjected to a variable magnetic field for facilitating creation of alternating heating and cooling cycles in each of the magnetocaloric elements;
a magnetic arrangement (3) comprising alternating magnetized zones (4) and non magnetized zones (5), the magnetic arrangement being rotatable around the central axis (A) for generating the variable magnetic field, and the magnetic arrangement (3) being completely located radially inside the circumferential arrangement defined by the magnetocaloric elements (2);
an annular field closing device (6) being arranged around and surrounding the circumferential arrangement of the magnetocaloric elements (2) and concentric with respect to the magnetic arrangement such that, upon rotation of the magnetic arrangement, a magnetic flux generated by the magnetized zones being sequentially looped through the magnetocaloric elements to alternately subject each of the magnetocaloric elements to a magnetic field variation and alternately create the heating cycle and the cooling cycle in each of the magnetocaloric elements, in synchronization with circulation of at least one heat transfer fluid which passes through the magnetocaloric elements during the heating and the cooling cycles;
wherein the annular field closing device comprises:
a heat insulation means;
a layer of at least one magnetically conductive sheet metal strip that is coiled on itself with a layer of a heat insulating material between successive coil turns of the layer of the at least one magnetically conductive sheet metal strip,
the layer of the at least one magnetically conductive sheet metal strip and the layer of a heat insulating material therebetween form an annulus comprising a plurality of concentric, radially alternating layers of the magnetically conductive and the heat insulating material; and the layer of the at least one magnetically conductive sheet metal strip comprising at least partly either iron, an iron alloy, or a magnetically conductive metal alloy including either cobalt or silicon; and the annular field closing device completely radially surrounding the circumferential arrangement of the magnetocaloric elements (2) such that the magnetocaloric elements are located radially within the annular field closing device.

2. The heat generator according to claim 1, wherein the field closing device comprises the at least one magnetically conductive sheet metal strip (11) that is coiled on itself and arranged around the magnetocaloric elements (2), and successive coil turns of the layer of the at least one magnetically conductive sheet metal strip that are spaced from one another with the layer of the heat insulating material therebetween, and a volume of air is located between successive coil turns of the at least one magnetically conductive sheet metal strip (11).

3. The heat generator according to claim 1, wherein the field closing device (6, 16, 26) comprises at least two magnetically conductive sheet metal strips (11) that are axially arranged side by side and axially spaced from one another forming a free space (14) therebetween.

4. The heat generator according to claim 3, wherein the field closing device (16) comprises a ring (8), the ring is made out of additional heat insulating material integrated in the space located between the at least two adjacent magnetically conductive sheet metal strips (11).

5. The heat generator according to claim 3, wherein the magnetic field closing device comprises four magnetically conductive sheet metal strips that are arranged side by side, each of the four magnetically conductive sheet metal strips has an associated layer of the heat insulating material comprising a varnish layer.

6. The heat generator according to claim 5, wherein the four magnetically conductive sheet metal strips are wrapped so as to surround the circumferential arrangement of the magnetocaloric elements (2) to form multiple wrapped layers of the four magnetically conductive sheet metal strips, and thereby facilitate maximum induction in the field closing device and thus increase an intensity of the magnetic flux passing through each magnetocaloric element resulting in an increased effectiveness and thermal efficiency of the heat generator.

7. The heat generator according to claim 6, wherein the four magnetically conductive sheet metal strips are manufactured from an iron-cobalt alloy and are arranged radially adjacent to one other with a free space located between each adjacent pair of the four magnetically conductive sheet metal strips.

8. The heat generator according to claim 1, wherein the layer of the heat insulation material is a varnish (9) that covers at least one side of the at least one magnetically conductive sheet metal strip (11).

9. The heat generator according to claim 1, wherein the at least one magnetically conductive sheet metal strip (11) comprises at least one canalizing device (15) integrated therein, and the at least one canalizing device extending longitudinally in the field closing device (26) and arranged opposite to a respective one of the magnetocaloric elements (2).

10. The heat generator according to claim 9, wherein the at least one canalizing device (15) is an assembly of magnetically conductive material parts (17) arranged side by side and spaced from one another.

11. The heat generator according to claim 10, wherein each of the magnetically conductive material parts (17) of the assembly are spaced from one another by additional heat insulating material.

12. The heat generator according to claim 9, wherein the at least one canalizing device (15) for the magnetic field lines has a trapezoidal shape, the trapezoidal shape has a first base, located adjacent and opposite to the respective one of the magnetocaloric elements (2), the first base has approximately a same width of a base of the respective one of the magnetocaloric elements (2); and the trapezoidal shape has a second base opposite and smaller than the first base.

13. The heat generator according to claim 1, wherein the magnetized zones (4) of the magnetic arrangement (3) are generated by permanent magnets.

14. A heat generator (1, 10, 20) comprising:

a plurality of magnetocaloric elements (2) being arranged in a circumferential arrangement around a central axis (A) and being subjected to a variable magnetic field for facilitating creation of alternating heating and cooling cycles in each of the magnetocaloric elements;

a magnetic arrangement (3) comprising alternating magnetized zones (4) and non magnetized zones (5), with the magnetic arrangement being rotatable around the central axis (A) for generating the variable magnetic field, and the magnetic arrangement (3) being located completely radially inside the circumferential arrangement of the magnetocaloric elements (2);

an annular field closing device (6) being arranged around and surrounding the circumferential arrangement of the magnetocaloric elements (2) and concentric with respect to the magnetic arrangement such that, upon rotation of the magnetic arrangement; and a magnetic flux being generated by the magnetized zones being sequentially looped through the magnetocaloric elements to alternately subject each of the magnetocaloric elements to a magnetic field variation and alternately create the heating cycle and the cooling cycle in each of the magnetocaloric elements, in synchronization with circulation of at least one heat transfer fluid which passes through the magnetocaloric elements during the heating and the cooling cycles;

wherein the annular field closing device comprises:

radially alternating at least one layer of a magnetically conductive sheet metal strip and at least one layer of a heat insulating material;

the at least one layer of the magnetically conductive sheet metal strip is coiled on itself with the at least one layer of the heat insulating material located between successive coil turns of the layer of the at least one magnetically conductive sheet metal strip;

the layer of the at least one magnetically conductive sheet metal strip coiled on itself and the layer of the heat insulating material therebetween form an annulus comprising a plurality of wound alternating radially layers of the at least one magnetically conductive sheet metal strip and the at least one layer of heat insulating material; and the layer of the at least one magnetically conductive sheet metal strip comprising at least partly either iron, an iron alloy, or a magnetically conductive metal alloy including either cobalt or silicon; and the annular field closing device being arranged to completely radially surround the circumferential arrangement of the magnetocaloric elements (2) so that the magnetocaloric elements are located radially within the annular field closing device.

15. The heat generator according to claim 14, wherein the magnetic field closing device comprises four magnetically conductive sheet metal strips that are arranged side by side, each of the four magnetically, conductive sheet metal strips has an associated layer of the heat insulating material comprising a varnish layer.

16. The heat generator according to claim 15, wherein the four magnetically conductive sheet metal strips are wrapped so as to surround the circumferential arrangement of the magnetocaloric elements (2) to form multiple wrapped layers of the four magnetically conductive sheet metal strips, and thereby facilitate maximum induction in the field closing device and thus increase an intensity of the magnetic flux passing through each magnetocaloric element resulting in an increased effectiveness and thermal efficiency of the heat generator.

17. The heat generator according to claim 16, wherein the four magnetically conductive sheet metal strips are manufactured from an iron-cobalt alloy and are arranged radially adjacent to one other with a free space located between each adjacent pair of the four magnetically conductive sheet metal strips.

* * * * *